(12) United States Patent
Brug et al.

(10) Patent No.: US 6,169,686 B1
(45) Date of Patent: *Jan. 2, 2001

(54) SOLID-STATE MEMORY WITH MAGNETIC STORAGE CELLS

(75) Inventors: James A. Brug, Menlo Park; Lung T. Tran, Saratoga; Thomas C. Anthony, Sunnyvale; Manoj K. Bhattacharyya, Cupertino; Janice Nickel, Palo Alto, all of CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/974,925

(22) Filed: Nov. 20, 1997

(51) Int. Cl.[7] .................................................... G11C 11/14
(52) U.S. Cl. ........................... 365/171; 365/158; 365/173
(58) Field of Search .................................. 365/157, 158, 365/171, 173, 170

(56) References Cited

U.S. PATENT DOCUMENTS

| | | | |
|---|---|---|---|
| 3,744,041 | * 7/1973 | Higashinakagawa et al. | 365/139 |
| 3,922,651 | * 11/1975 | Imamura et al. | 365/171 |
| 4,529,621 | * 7/1985 | Ballard | 365/171 |
| 4,722,073 | * 1/1988 | Lampe et al. | 365/158 |
| 4,887,236 | * 12/1989 | Schloemann | 365/173 |
| 5,039,656 | * 8/1991 | Hideka | 365/161 |
| 5,276,639 | * 1/1994 | Inoue | 365/162 |
| 5,289,410 | * 2/1994 | Katti et al. | 365/170 |
| 5,329,480 | * 7/1994 | Wu et al. | 365/170 |
| 5,640,343 | * 6/1997 | Gallagher | 365/171 |
| 5,650,958 | * 7/1997 | Gallagher | 365/173 |

FOREIGN PATENT DOCUMENTS 197 44 095A1 * 4/1999 (DE) .

OTHER PUBLICATIONS

European Search Report, Application No.: EP 98 30 8662, dated May 27, 1999.

* cited by examiner

Primary Examiner—David Nelms
Assistant Examiner—Gene N. Auduong

(57) ABSTRACT

A solid-state memory including an array of magnetic storage cells and a set of conductors. The process steps that pattern the conductors also patterns the magnetic layers in the magnetic storage cells thereby avoiding the need to employ precise alignment between pattern masks.

10 Claims, 5 Drawing Sheets

SOLID-STATE MEMORY WITH MAGNETIC STORAGE CELLS

BACKGROUND OF THE INVENTION

1. Field of Invention

The present invention pertains to the field of solid-state memories. More particularly, this invention relates to a solid-state memory with magnetic storage cells.

2. Art Background

Solid-state memories have a wide variety of applications particularly in computer systems. Prior solid-state memories are usually constructed of semiconductor materials. For example, prior semiconductor memories include dynamic random access memories (DRAMs) as well as persistent or non-volatile memories such as flash memories to name a few.

A prior solid-state memory is typically arranged as one or more arrays of memory cells or storage cells. The structure of each storage cell usually provides a mechanism for storing a bit of information. For example, the storage cells in a typical DRAM include structures that form a capacitor for storing information as an electrical charge. In addition, the storage cells in a typical flash memory include structures that form a floating-gate for persistent storage of an electrical charge.

Typically, such specialized structures in prior solid-state memories require critical alignment in order to achieve high storage cell densities. For example, high density DRAM cells usually require critical alignments in the trenched or stacked capacitor structures contained therein. In addition, flash cells typically require critical alignment among the floating-gate structures contained therein.

Such storage cell structures are usually formed using multiple pattern masks according to the particular process technology used for fabrication of the solid-state memory. Typically, the critical alignments of such structures requires a relatively precise alignment among the pattern masks. Unfortunately, process technologies that achieve precise alignment of pattern masks are usually expensive and therefore greatly increase the cost of prior high density solid-state memories.

In addition, prior solid-state memories usually are formed on single crystalline semiconductor materials. Unfortunately, the requirement of a crystalline semiconductor substrate limits the flexibility in which any storage cells may be arranged. For example, a typical crystalline semiconductor substrate used for fabricating prior solid-state storage cells usually precludes the stacking of arrays of DRAM or flash storage cells into multiple layers. Such limitations limit the storage densities that may be achieved with prior solid-state memories.

SUMMARY OF THE INVENTION

A solid-state memory is disclosed which includes an array of magnetic storage cells and a set of conductors coupled to the magnetic storage cells. The solid-state memory is manufactured so that the process steps that pattern the conductors also pattern the magnetic layers in the magnetic storage cells, thereby avoiding the need to employ precise alignment between pattern masks. In addition, the magnetic storage cells are not formed on a single crystalline semiconductor substrate. As a consequence, the arrangement of magnetic storage cells is not limited by the inherent limitations of such substrates.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 3b is a cross-sectional view AA which illustrates patterning of the material shown in FIG. 3a;

DETAILED DESCRIPTION

Figure 1:
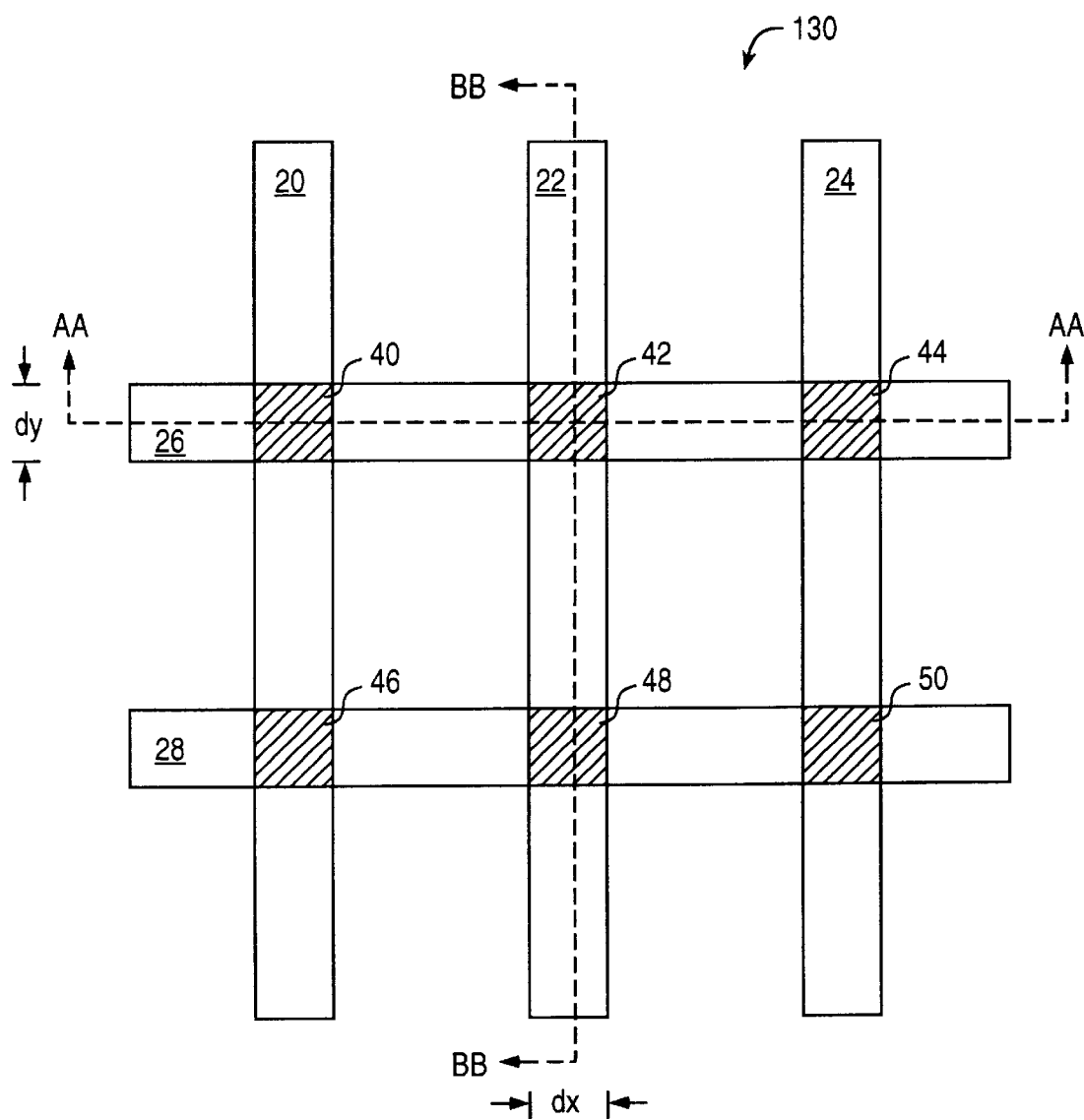
FIG. 1 is a top view of a solid-state memory which includes an array of magnetic storage cells and an array of conductors that enable read and write access to the magnetic storage cells.

FIG. 1 is a top view of a solid-state memory 130 which includes an array of magnetic storage cells 40–50. The solid-state memory 130 also includes an array of conductors 20–28 that enable read and write access to the magnetic storage cells 40–50. The magnetic storage cells 40–50 use magnetic fields to store information. Each of the magnetic storage cells 40–50 enables storage of a corresponding bit of information which may be referred to as a data bit.

The magnetic storage cells 40–50 and the conductors 20–28 are formed onto a substrate 10. The conductors 20–28 are arranged as a set of top conductors 26–28 and an orthogonal set of bottom conductors 20–24. Each of the magnetic storage cells 40–50 has rectangular dimensions $d_x$ and $d_y$ which are defined by the widths of the bottom conductors 20–24 and the widths of the top conductors 26–28, respectively.

Figure 2A:
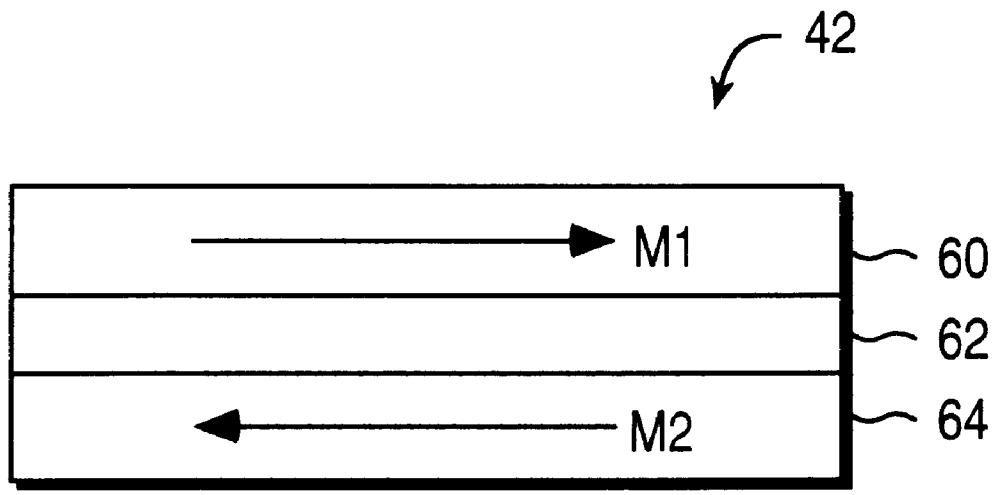
FIGS. 2a–2b illustrates the storage of a data bit in a magnetic storage cell.
Figure 2B:
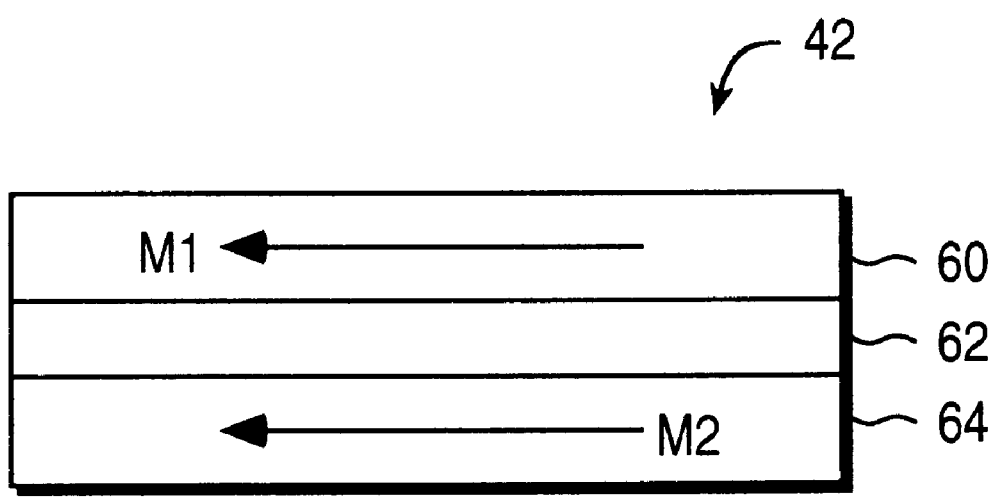

FIGS. 2a–2b illustrates the storage of a data bit in the magnetic storage cell 42. The magnetic storage cell 42 includes a magnetic film 60 and a magnetic film 64 which are separated by a dielectric region 62. The structure and the functionality of the remaining storage cells 40–50 are substantially similar to that of the magnetic storage cell 42. The orientation of magnetization in the magnetic film 60 is shown as M1 and the orientation of magnetization in the magnetic film 64 is shown as M2.

One of the magnetic films 60 and 64 has a fixed orientation of magnetization while the other has a non-fixed orientation of magnetization. The one of the magnetic films 60 and 64 having a non-fixed orientation of magnetization is the active magnetic film of the magnetic storage cell 42. The active magnetic film rotates its orientation of magnetization in response to electrical signals applied to the conductors 22 and 26 during write operations to the magnetic storage cell 42. In one embodiment, a first logic state of the data bit stored in the magnetic storage cell 42 is indicated when M1 and M2 are parallel and a second logic state is indicated when M1 and M2 are anti-parallel.

In other embodiments, other arrangements of magnetic orientations may be employed for storing information in the magnetic storage cell 42. For example, the pinned magnetic film in the magnetic storage cell may be switched and in response the non-pinned magnetic film switches to be anti-parallel to the pinned magnetic film. The pinned magnetic film may be the top magnetic film 60 or the bottom magnetic film 64.

In one embodiment, the magnetic film 64 is pinned with a fixed orientation of magnetization M2 while the magnetic film 60 has non-fixed orientation of magnetization M1. The orientation of magnetization M1 in the magnetic film 60 changes in response to electrical signals applied to the conductors 22 and 26 during write operations to the magnetic storage cell 42.

FIG. 2a illustrates a "0" logic state of a data bit stored in the magnetic storage cell 42. In the "0" logic state the orientation of magnetization in the magnetic film 60 (M1) is antiparallel to the orientation of magnetization M2 in the magnetic film 64. FIG. 2b shows a "1" logic state of the magnetic storage cell 42. In the "1" logic state, M1 is parallel to M2.

The magnetic storage cell 42 is read by applying a voltage potential, which may be referred to as a read voltage, across the conductors 26 and 22. The read voltage causes an electrical current, also known as a sense current, to flow between the magnetic films 60–64 as electrical charge migrates through the dielectric region 62 according to a phenomenon known as spin tunneling. The storage cell 42 may be referred to as a spin tunneling storage cell.

The resistance of the magnetic storage cell 42 differs according to the orientations of M1 and M2. When M1 and M2 are antiparallel, the "0" logic state, the resistance of the magnetic storage cell 42 is at its highest. On the other hand, the resistance of the magnetic storage cell 42 is at its lowest when M1 and M2 are parallel which corresponds to the "1" logic state. As a consequence, the logic state of the data bit stored in the magnetic storage cell 42 can be determined by measuring its resistance. The resistance of the magnetic storage cell 42 is reflected by the magnitude of the sense current that flows in response to the read voltage applied to the conductors 22 and 26.

FIGS. 3a–3e illustrate the formation of the array of magnetic storage cells 40–50 and the conductors 20–28 on the substrate 10. In one embodiment, the substrate 10 is a silicon substrate that accommodates the formation of support electronics for the solid-state memory 130 such as sense amplifier and multiplexor circuitry. The process steps for the formation of the magnetic storage cells 40–50 and the conductors 20–28 does not require that the substrate 10 be a semiconductor material.

Figure 3A:
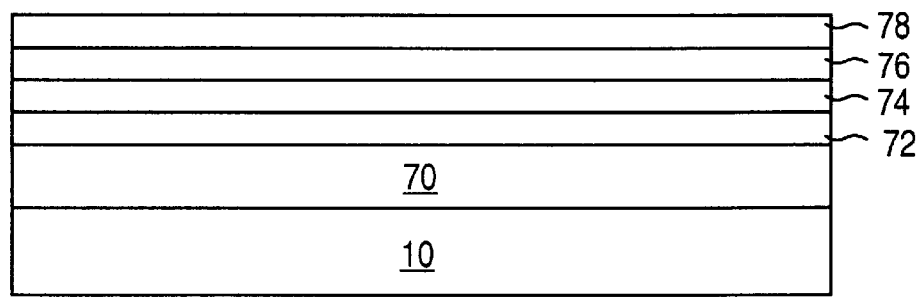
FIG. 3a is a cross-sectional view AA which shows a series of materials which are initially deposited onto a substrate and which are subsequently formed into conductors and magnetic storage cells.

FIG. 3a is a cross-sectional view AA which shows a series of materials 70–78 which are initially deposited onto the substrate 10. A layer of conductor material 70 is deposited onto the substrate 10 and provides a layer of conductive material for the formation of the conductors 20–24 which are the bottom conductors for the solid-state memory 130. The conductor material 70 is a sheet of conductive material such as copper, aluminum, or gold, or alloys of these materials.

In one embodiment, an antiferromagnetic material 72 is deposited on top of the conductor material 70. The antiferromagnetic material 72 provides a magnetic pinning material for fixing the orientations M2 in the magnetic storage cells 40–50 to be formed on the substrate 10. The antiferromagnetic material 72 may be iron-manganese (FeMn) or nickel-manganese (NiMn). Alternative materials for the antiferromagnetic material 72 include NiO and IrMn.

A magnetic film 74 is deposited on top of the antiferromagnetic material 72. The effect of magnetic exchange coupling between the magnetic film 74 and the antiferromagnetic material 72 pins the orientation of the magnetization in the magnetic film 74. The magnetic film 74 provides a layer of pinned magnetic material for forming the pinned magnetic film regions of the magnetic storage cells 40–50. For example, the magnetic film 74 is subsequently formed into the pinned magnetic film 64 of the magnetic storage cell 42. The magnetic film 74 may be nickel-iron(NiFe) or cobalt or alloys or layers comprised of combinations of these materials. Alternative materials for the magnetic film 74 include $Fe_3O_4$ and $CrO_2$ or other ferromagnetic or ferrimagnetic materials.

An insulating material 76 is deposited on the magnetic film 74. The insulating material 76 provides a layer for forming the dielectric regions of the magnetic storage cells 40–50, such as the dielectric region 62 of the magnetic storage cell 42. In one embodiment, the insulating material 76 is aluminum-oxide ($Al_2O_3$). Alternative materials of the insulating material 76 include silicon-dioxide ($SiO_2$), tantalum-oxide ($Ta_2O_5$), and silicon-nitride ($Si_3N_4$).

A magnetic film 78 is deposited on top of the insulating material 76. The magnetic film 78 provides a layer of material for forming the active regions of the magnetic storage cells 40–50, such as the magnetic film 60 of the storage cell 42. The magnetic film 78 may be nickel-iron (NiFe) or cobalt or alloys or layers comprised of combinations of these materials. Alternative materials for the magnetic film 78 include $Fe_3O_4$ and $CrO_2$ or other ferromagnetic or ferrimagnetic materials.

Figure 3B:
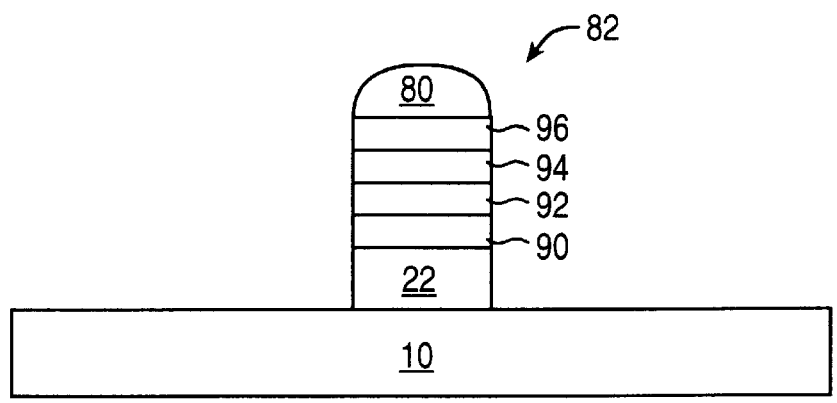

FIG. 3b is a cross-sectional view AA which illustrates a patterning of the material shown in FIG. 3a. The patterning is performed by forming lines of photo-resist, including the photo-resist 80, on top of the magnetic film 78 using photolithography. The line of photo-resist 80 defines the length of the bottom conductor 22 and the $d_x$ dimension of the bottom conductor 22 and the magnetic storage cells 42 and 48. An ion milling operation is performed to remove the materials from the substrate 10 that are not protected by photo-resist. The ion milling operation may be performed, for example, with a bombardment of argon ions. The protection provided by the photo-resist 80, for example, results in the formation of a stacked structure 82 from the materials shown in FIG. 3a.

The stacked structure 82 includes the bottom conductor 22 which is a remnant of the conductor material 70. The stacked structure 82 also includes a strip of antiferromagnetic material 90 which remains from the antiferromagnetic material 72. The strip of antiferromagnetic material 90 pins the magnetic orientations M2 of the magnetic storage cells 42 and 48 in a direction parallel to the length of the conductor 22.

The stacked structure 82 includes a strip of magnetic film 92, a strip of dielectric material 94, and a strip of magnetic film 96, which remain from the magnetic film 74, the dielectric material 76, and the magnetic film 78, respectively. The strips of magnetic film 92, dielectric material 94, and the magnetic film 96 are to be formed into the magnetic storage cells 42 and 48 with subsequent patterning steps.

Figure 3C:
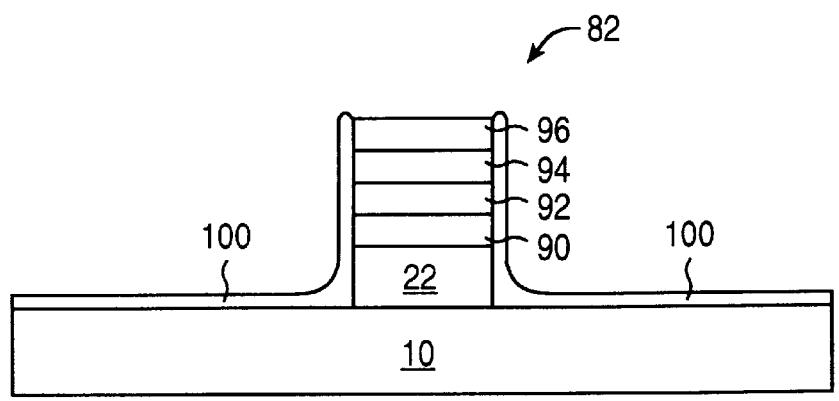
FIG. 3c is a cross-sectional view AA which shows a thin layer of protective dielectric that covers the sides of the patterned stacked structures and the exposed area of the substrate.

FIG. 3c is a cross-sectional view AA which shows a thin layer of protective dielectric 100 that covers the sides of the stacked structure 82 and the exposed area of the substrate 10. The protective dielectric 100 is initially deposited over the stacked structure 82, and the photo-resist 80 and exposed areas of the substrate 10 as a thin layer, for example 500 Å or less, of dielectric material. The photo-resist 80 and other lines of photo-resist used for patterning the conductors 20–24 are then removed using for example an ultrasonic agitator with a solvent. The resulting protective dielectric 100 prevents short circuits between edges of the magnetic films 92 and 96 after the conductors 26 and 28 are formed.

Figure 3D:
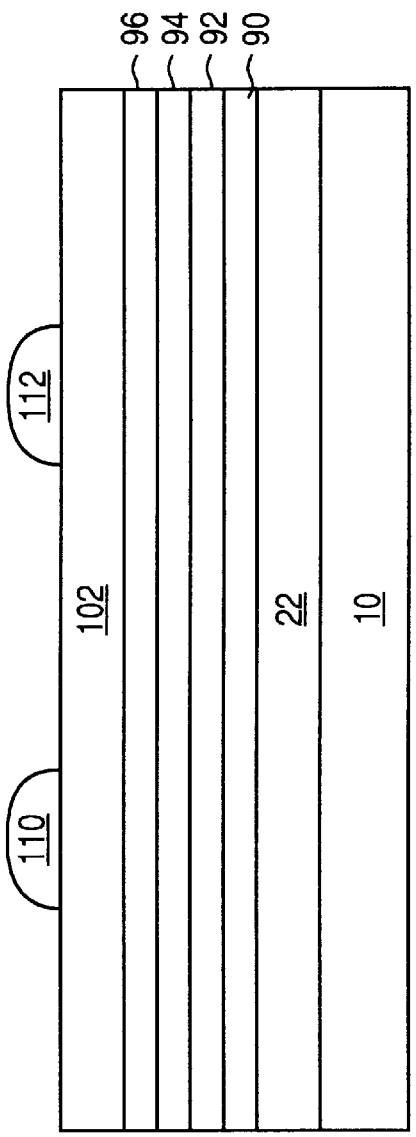
FIG. 3d is a cross-sectional view BB which shows a conductor material and top conductor photo-resist deposited over the stacked structures and the protective dielectric.

FIG. 3d is a cross-sectional view BB which shows a conductor material 102 deposited over the stacked structure 82 and the protective dielectric 100. The conductor material 102 provides a layer of conductive material for the formation of the top conductors 26–28. The conductor material 102 is a sheet of conductive material such as copper, aluminum, or gold, or alloys of these materials.

The top conductors 26–28 are then patterned from the conductor material 102. The patterning of the top conductors 26–28 forms the $d_y$ dimensions of the magnetic storage cells 40–50 and the top conductors 26–28 and automatically aligns the top conductors 26–28 and the layers of the magnetic storage cells 40–50. The top conductors 26–28 are patterned by forming lines of photo-resist including the lines of photo-resist 110–112 on top of the conductor material 102 using photolithography. The lines of photo-resist 110–112 each have a width $d_y$.

An ion milling step is used to remove materials not protected by the photo-resist 110–112. In one embodiment, the milling step is used to remove materials down to the strip of antiferromagnetic material 90. In another embodiment, the milling step is stopped before the strip of magnetic film 92 is removed. The photoresist 110–112 is then stripped away.

Figure 3E:
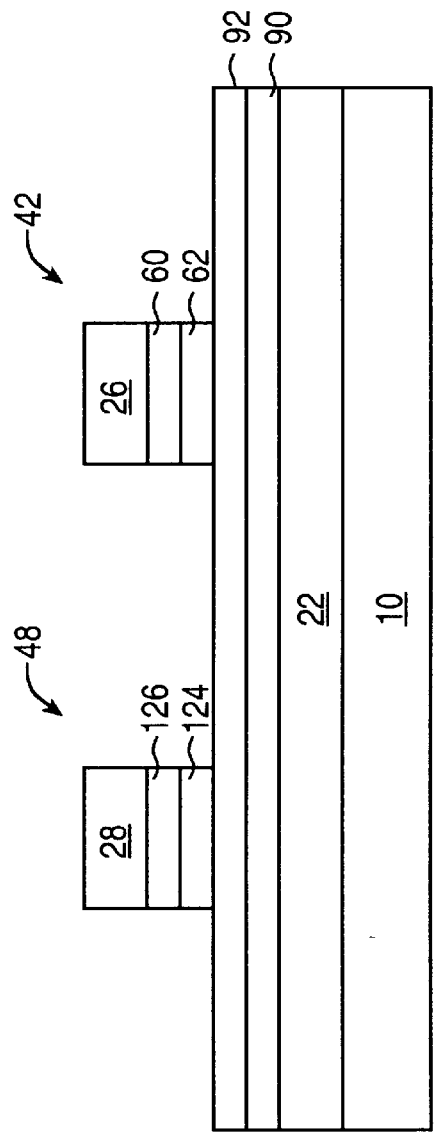
FIG. 3e is a cross-sectional view BB which shows the results of a milling step which stops before the strip of pinned magnetic film.

FIG. 3e is a cross-sectional view BB which shows the results of the milling step which stops before the removal of the magnetic film 92. The magnetic storage cell 42 is shown with the magnetic film 60 and the dielectric region 62 formed from the strip of magnetic film 96 and the strip of dielectric material 94, respectively. The magnetic storage cell 48 includes a magnetic film 126 and a dielectric region 124 formed from the strip of magnetic film 96 and the strip of dielectric material 94, respectively.

The strip of magnetic material 92 provides a continuous pinned magnetic film for both the magnetic storage cells 42 and 48. This embodiment prevents magnetic fields that would otherwise emanate from patterned edges of the magnetic material 92 from affecting the magnetic fields in the active magnetic films of magnetic storage cells 42 and 48.

The patterning of the top conductors 26 and 28 patterns and automatically aligns the active magnetic films in the magnetic storage cells 42 and 48 to provide the aligned $d_x$ and $d_y$ dimensions. As a consequence, there is no need to use separate pattern masks for the conductors 26–28 and the active layers or dielectric layers of the magnetic storage cells 42 and 48 nor to precisely align any such pattern masks.

The structure shown in FIG. 3e may subsequently be planarized, using for example an dielectric layer, and another array of magnetic storage cells formed on top of the magnetic storage cells 40–50. This is possible because no single crystalline semiconductor substrate is required. The ability to have many layers of magnetic storage cells enhances the overall density that can be attained in the solid-state memory 130.

Figure 4:
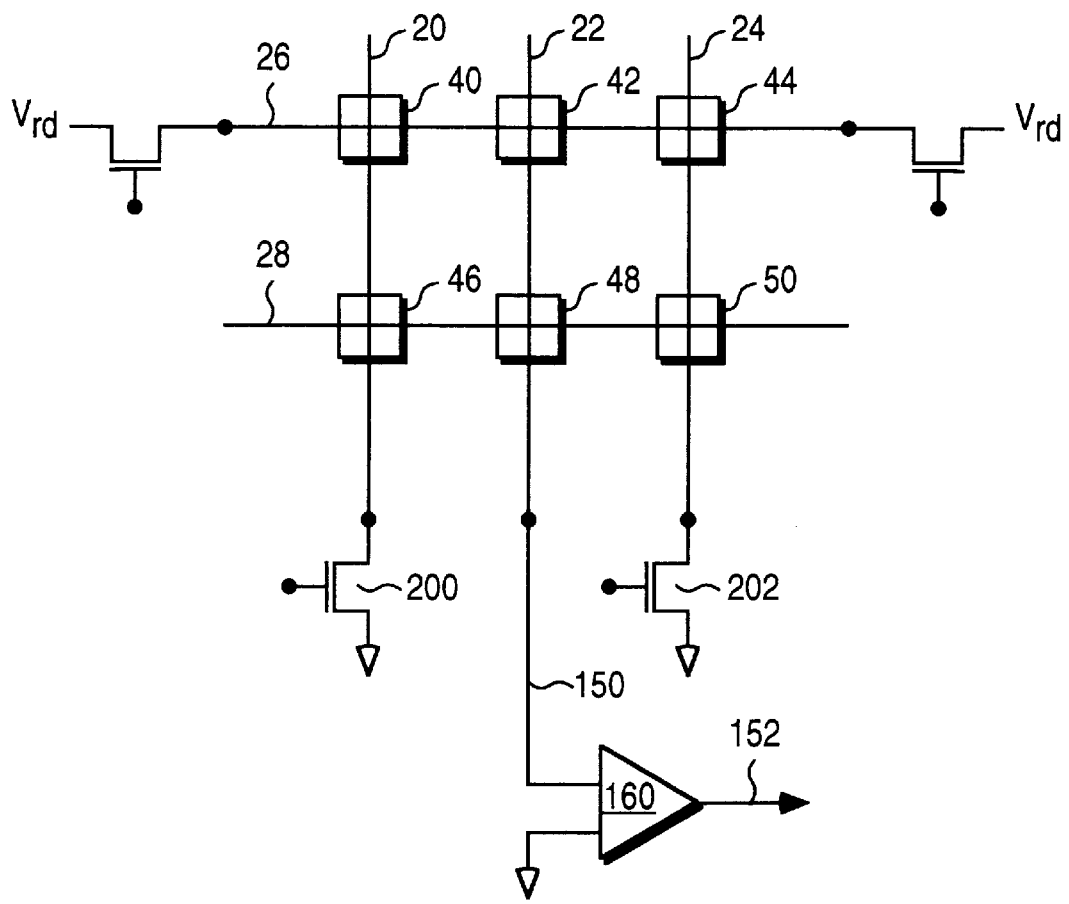
FIG. 4 shows an arrangement for reading a magnetic storage cell.

FIG. 4 shows an arrangement for reading the magnetic storage cell 42. The magnetic storage cell 42 is read by applying a read voltage $V_{rd}$ to the conductor 26 and coupling the conductor 22 to an input 150 of a current sense amplifier 160. The potential $V_{rd}$ across the magnetic storage cell 42 causes a sense current to flow into the input 150 of the current sense amplifier 160. The magnitude of the sense current indicates the resistance of the magnetic storage cell 42 and therefore its logic state.

During the read operation, the conductors 20 and 24 are applied with a ground potential using a pair of transistors 200–202. In addition, the input 150 of the current sense amplifier 160 has a virtual ground potential which means that the conductor 22 has a virtual ground potential. The ground and virtual ground potentials of the conductors 20–24 reduce the amount of current flow between the conductors 20–24. This current flow is known as leakage current. The reduced amount of leakage current in the conductors 20–24 increases the signal to noise ratio during read operations on the magnetic storage cell 42.

The equalized potentials among the conductors 20–24 can be accomplished using a variety of circuits. For example, the transistors 200–202 may apply a potential $V_x$ to the conductors 20 and 24 and the input 150 may have a potential of $V_x$. In addition, each of the conductors may be coupled to an input of a corresponding current sense amplifier. The inputs of the current sense amplifiers may be virtual grounds or may have some other potential so long as the potentials of all the conductors 20–24 are equalized. Moreover, any combination of transistors and current sense amplifiers may be used to equalize the potentials of the conductors 20–24 during read operations.

Figure 5:
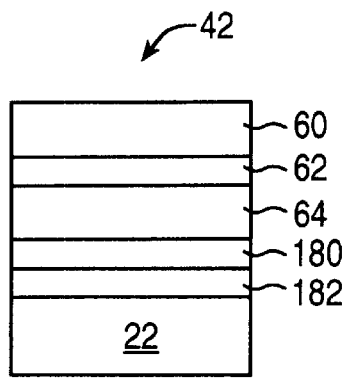
FIG. 5 shows an alternative arrangement of a magnetic storage cell which incorporates a diode structure to increase the signal to noise ratio during read operations.

FIG. 5 shows an alternative arrangement of the magnetic storage cells 40–50 which incorporates a diode structure to increase the signal to noise ratio during read operations. For example, the magnetic storage cell 42 in this arrangement includes a diode structure formed from a platinum layer 180 and a silicon layer 182. A high temperature processing step is used to form polysilicon from the silicon layer 182 prior to the deposition of the materials 60–64.

The conductors 20–28 have a relatively low impedance compared to the impedance of the spin tunneling junctions of the magnetic storage cells 40–50. However, as the size of the array of storage cells of the solid-state memory 130 increases, the loading effect of the conductors for the larger array can cause excessive leakage. Diode structures such as the one shown incorporated into the magnetic storage cells can decrease cross-talk or leakage current among the conductors. The decrease in leakage current increases the signal to noise ratio attainable during read operations particularly for large array sizes.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A memory, comprising:
    array of magnetic storage cells each for storing a bit of information, each magnetic storage cell having an active layer for storing a rotatable magnetization and a reference layer having a fixed magnetization wherein the reference layers are provided by a set of magnetic films in the array arranged as continuous strips to prevent magnetic fields from emanating from the reference layers and affecting magnetic fields in the active layers;

a set of top conductors coupled to the magnetic storage cells wherein a patterning step that formed the top conductors also patterned the magnetic storage cells.

2. The memory of claim 1, wherein the patterning step patterned the active layer in each of the magnetic storage cells.

3. The memory of claim 1, wherein the patterning step patterned the active layer and a dielectric region in each of the magnetic storage cells.

4. The memory of claim 1, wherein the patterning step patterned the active layer and a dielectric region and the magnetic film in each of the magnetic storage cells.

5. The memory of claim 1, further comprising a set of bottom conductors that are substantially orthogonal to the top conductors and that are coupled to the magnetic storage cells wherein a patterning step that formed the bottom conductors also patterned the active layer and a dielectric region and the magnetic film in each of the magnetic storage cells.

6. The memory of claim 1, further comprising a dielectric layer that prevents the top conductors from causing short circuits among layers of the magnetic storage cells.

7. The memory of claim 5, further comprising:

current sensing amplifier having an input coupled to one of the bottom conductors to sense an electrical current from one of the magnetic storage cells being read;

circuitry for applying a potential to each of the bottom conductors not coupled to the magnetic storage cell being read such that the potentials of the bottom conductors not coupled to the magnetic storage cell being read are substantially equal to the potential of the input to the current sense amplifier to reduce an amount of leakage electrical current among the bottom conductors.

8. The memory of claim 7, wherein the circuitry for applying a potential to each of the bottom conductors not coupled to the magnetic storage cell being read includes at least one transistor.

9. The memory of claim 7, wherein the circuitry for applying a potential to each of the bottom conductors not coupled to the magnetic storage cell being read includes at least one other current sense amplifier having an input with the potential.

10. The memory of claim 1, wherein each magnetic storage cell includes a diode structure that reduces an amount of leakage electrical current during read operations in the memory.

* * * * *